United States Patent [19]

Kase

[11] Patent Number: 5,017,805
[45] Date of Patent: May 21, 1991

[54] OFFSET CANCEL LATCHING COMPARATOR

[75] Inventor: Kiyoshi Kase, Chiba, Japan

[73] Assignee: Motorola, Inc., Schaumburg, Ill.

[21] Appl. No.: 438,910

[22] Filed: Nov. 17, 1989

[30] Foreign Application Priority Data

Nov. 24, 1988 [JP] Japan .................................. 63-294510

[51] Int. Cl.$^5$ .............................................. H03K 5/24
[52] U.S. Cl. ..................................... 307/362; 307/491; 307/494; 307/497
[58] Field of Search ................ 307/350, 530, 362, 491, 307/494, 496, 497

[56] References Cited

U.S. PATENT DOCUMENTS

| | | | |
|---|---|---|---|
| 3,849,673 | 11/1974 | Koo | 307/530 |
| 4,802,130 | 1/1989 | Soneda | 307/530 |
| 4,858,195 | 8/1989 | Soneda | 307/530 |

*Primary Examiner*—John Zazworsky
*Attorney, Agent, or Firm*—Michael D. Bingham; Robert D. Atkins

[57] ABSTRACT

A differential pair of transistors (Q2, Q3), the sources of which are connected to a current source (Q1); first and second input terminals (IN, VX) connected to the gates of the first and second transistors respectively; first and second output terminals (DN, DP) connected to the drains of the second and first transistors; third and fourth transistors (Q6, Q7), the sources of which are connected to a voltage supply (UDD), the drain of the third transistor being connected to the drain of the first transistor, and the drain of the fourth transistor being connected to the drain of the second transistor; the gate of the third transistor being connected to the drain of the first transistor via first switch (Q104) and connected to the drain of the second transistor via a first capacitor (C1); and the gate of the fourth transistor being connected to the drain of the second transistor via second switch (Q5) and connected to the drain of the first transistor via a second capacitor (C2).

13 Claims, 2 Drawing Sheets

OFFSET CANCEL LATCHING COMPARATOR

FIELD OF THE INVENTION

The present invention relates, in general, to a latching comparator. More particularly, the invention relates to an offset cncel latching comparator which may cancel an offset voltage caused by transistor mismatch in the comparator.

BACKGROUND OF THE INVENTION

In the prior art it is well known that latching comparators comparing two input voltages have many applications such as analog to digital converters used in VCR. Such comparator includes a pair of differential inputs for receiving two input voltages to be compared, a pair of transistors differentially driven by the differential input voltages, and a pair of differential outputs. In such differentially operating latching comparators, even when the input voltage difference is zero the differential output voltage undesirably does not become zero, that is, there exists a nonzero input offset voltage which must be applied to drive the output voltage difference to zero. This offset voltage is unwanted because it leads to malfunction or wrong outputs as explained later in more detail. Especially the offset error is serious in latching comparators applied to A/D converter, because the comparators must respond at high speed to small signal inputs. Therefore reducing the offset voltage is desired in many applications.

The predominant source of the offset error is the mismatch of the transistor pair mainly due to a wafer process inaccuracy such as gate length variation, gate width variation, oxide thickness variation, etc. Accordingly, it is possible to reduce the offset voltage by using a large geometric size which makes it easier to match the transistor pair. However, the large geometry causes slow response and requires very wide area on the silicon resulting in the die cost increasing.

SUMMARY OF THE INVENTION

Accordingly, it is an object of the present invention to provide an improved latching comparator.

It is further an object of the present invention to provide an improved offset cancel latching comparator which may cancel offset voltage to eliminate an offset error.

It is still further an object of the present invention to provide such an offset cancel latching comparator which can cancel offset voltage by storing offset information in two capacitors.

In carrying out the above and other objects of the invention, there is provided an offset cancel latching comparator comprising first and second input terminals(IN, VX); first and second output terminals(DN, DP); first and second transistors(Q2, Q3) forming a first differential pair, control electrodes of the first and second transistors being connected to the first and second input terminals respectively, first electrodes of the first and second transistors both being connected to a current source(Q1), and a second electrode of the second transistor being connected to the first output terminal and, a second electrode of the first transistor being connected to the second output terminal; third and fourth transistors(Q6, Q7) forming a second differential pair, first electrodes of the third and fourth transistors both being connected to a voltage supply(VDD), a second electrode of the third transistor being connected to the second electrode of the first transistor, and a second electrode of the fourth transistor being connected to the second electrode of the second transistor; a control electrode of the third transistor being connected to the second electrode of the first transistor via first switch(Q4), and connected to the second electrode of the second transistor via a first capacitor(C1); and a control electrode of the fourth transistor being connected to the second electrode of the second transistor via a second switch(Q5), and connected to the second electrode of the first transistor via a second capacitor(C2).

In a preferred embodiment of the invention, an offset cancel latching comparator comprises first and second field effect transistors(Q2, Q3) forming a first differential pair, source electrodes of the first and second transistors both being connected to a current source(Q1); a first input terminal(IN) connected to a gate electrode of the first transistor; a second input terminal(VX) connected to a gate electrode of the second transistor; a first output terminal(DN) connected to a drain electrode of the second transistor; a second output terminal(DP) connected to a drain electrode of the first transistor; third and fourth transistors(Q6, Q7) forming a second differential pair, source electrodes of the third and fourth transistors both being connected to a voltage supply(VDD), a drain electrode of the third transistor being connected to the drain electrode of the first transistor, and a drain electrode of the fourth transistor being connected to the drain electrode of the second transistor; a gate electrode of the third transistor being connected to the drain electrode of the first transistor via a first switch(Q4), and connected to the drain electrode of the second transistor via a first capacitor(C1); and a gate electrode of the fourth transistor being connected to the drain electrode of the second transistor via a second switch(Q5), and connected to the drain electrode of the first transistor via a second capacitor(C2).

These and other objects and advantages will be apparent to one of skill in the art from the detailed description below taken together with the drawings.

DETAILED DESCRIPTION OF THE INVENTION

Figure 2:
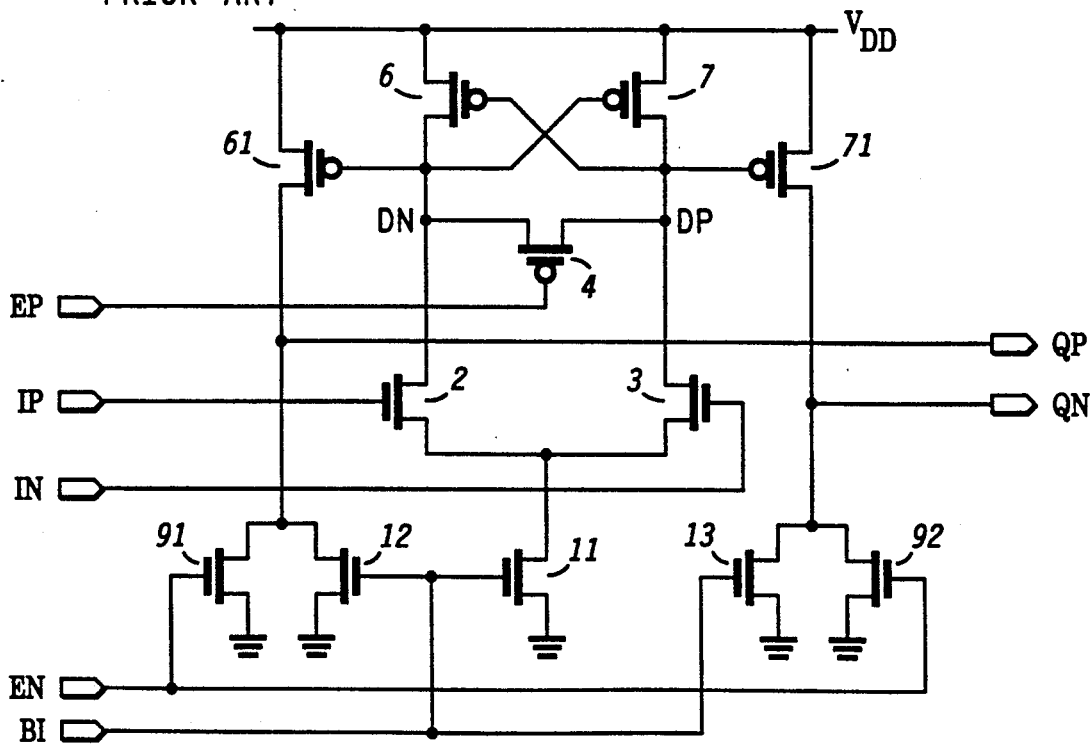
FIG. 2 is a circuit diagram of a conventional latching comparator.

In order to facilitate understanding the present invention, a reference will be made to a conventional latching comparator. Referring to FIG. 2, a pair of n-channel field effect transistors 2 and 3 are shown. A non-inverting input terminal IP is connected to the gate of transistor 2, and an inverting input terminal IN is connected to the gate of transistor 3. Differential input voltages are applied at terminals IP and IN as different inputs to the latching comparator. The sources of transistors 2 and 3 both are connected to the drain of an n-channel field effect transistor 11, which functions as a constant current source. An inverting output node DN and a non-inverting output node DP are connected to the drains of transistors 2 and 3 respectively, and further connected to the gates of p-channel field effect transistors 61 and 71 respectively. A non-inverting output terminal QP and an inverting output terminal QN are connected to the drains of transistors 61 and 71 respectively. The sources of transistors 61 and 71 both are connected to a voltage power supply VDD. A terminal BI is a bias voltage input terminal for n-channel field effect transistors 11, 12 and 13. A terminal EN is connected to the gates of n-channel field effect transistors 91 and 92. A terminal EP is connected to the gate of a p-channel field effect transistor 4, which is inserted between the drains of transistors 2 and 3. The input signals at terminals EN and EP function as clock inputs for enabling comparison and latching. A pair of p-channel field effect transistors 6, 7 are inserted between voltage power supply VDD and output nodes DN, DP respectively. The gates of each transistor 6 and 7 are connected to the drain of the opposite transistor to provide positive feedback.

Figure 3A:
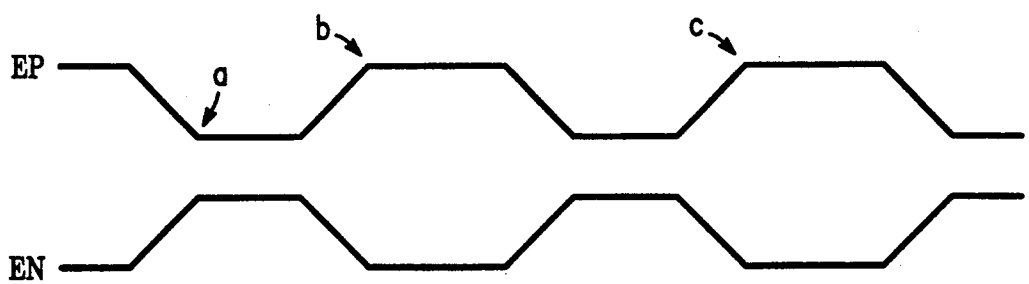
FIGS. 3A and 3B are timing waveform diagrams explaining the operations of the circuits shown in FIGS. 1 and 2, with FIG. 3C illustrating the differential outputs of an ideal matched circuit, FIG. 3D illustrating the outputs of the prior mismatched circuit in FIG. 2, and FIG. 3E illustrating the outputs of the circuit of the invention shown in FIG. 1.
Figure 3B:
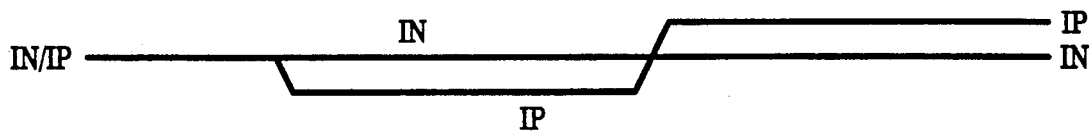
Figure 3C:
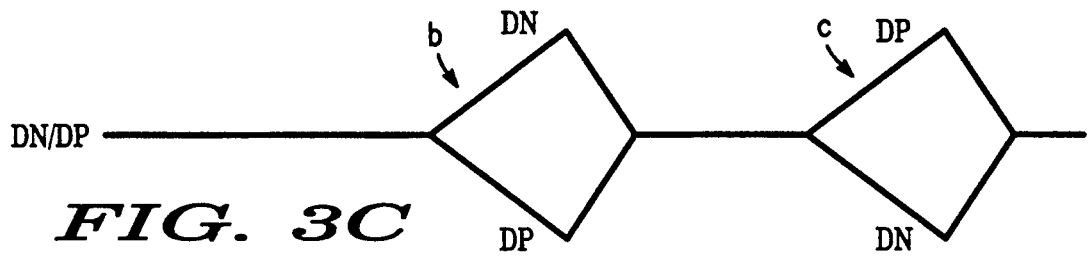

In operation, the differential input voltages supplied via terminals IP and IN to the latching comparator generates different drain currents through transistors 2 and 3. During an initial period where terminal EP is low and terminal EN is high (shown at "a" in FIG. 3A), nodes DP and DN are at almost the same voltage level because of shorting through transistor 4. Next, during a comparison period where terminal EP is high and terminal EN is low (shown at "b" and "c" in FIG. 3A), the output voltages at terminals DP and DN, ideally, move toward proper directions (as shown in FIG. 3C, "b" and "c"), which are determined depending on the differential input voltages at terminals IP and IN (shown in FIG. 3B). More specifically, when the inverting input voltage at IN is higher than the non-inverting input voltage at IP (shown in the middle of FIG. 3B), transistor 3 has a reduced resistance less than that of transistor 2 and therefore the non-inverting output voltage at DP is lower than the inverting output voltage at DN (shown at "b" in FIG. 3C). When the non-inverting input voltage at IP is higher than the inverting input voltage at IN (shown in the right side in FIG. 3B), transistor 2 has a reduced resistance less than that of transistor 3 and therefore the non-inverting output voltage at DP is expected to be higher than the inverting output voltage at DN (shown at "c" in FIG. 3C).

Figure 3D:
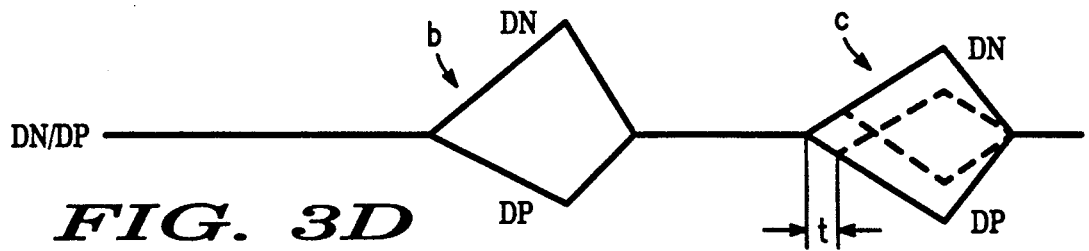

In the actual comparator, however, because there is an offset voltage due to the mismatching of transistor pair 2 and 3 as mentioned above, the comparison result becomes wrong quite often. Assuming that the prior circuit as shown in FIG. 2 has an offset that tends to drive the inverting output voltage at DN high, there is no problem when the inverting input voltage at IN is high (shown at "b" in FIG. 3D), but the wrong result is obtained when the inverting input voltage at IN is low (shown at "c" in FIG. 3D).

More specifically, in such prior circuit, although there exists an output offset voltage, delta V (not shown in FIG. 3D), it is clamped to "zero" during the initial period by shorting nodes DN and DP through clamping transistor 4. During the comparison period, when clamping transistor 4 is turned off by giving a high level at EP, the output offset voltage is immediately applied to nodes DN and DP and the positive feedback assists the tendency to drive DN high. Then the differential input voltages (high IP and low IN) are applied to transistors 2 and 3, and the differential output drain currents are applied to the circuit. However, these differential currents can not overcome the output offset and the assisting positive feedback and can not move toward the proper direction (DP is high), because the output currents are realized after a substantial delay time "t". As a result, the overwhelming wrong output voltages are provided as indicated by solid lines "c" in FIG. 3D.

Figure 1:
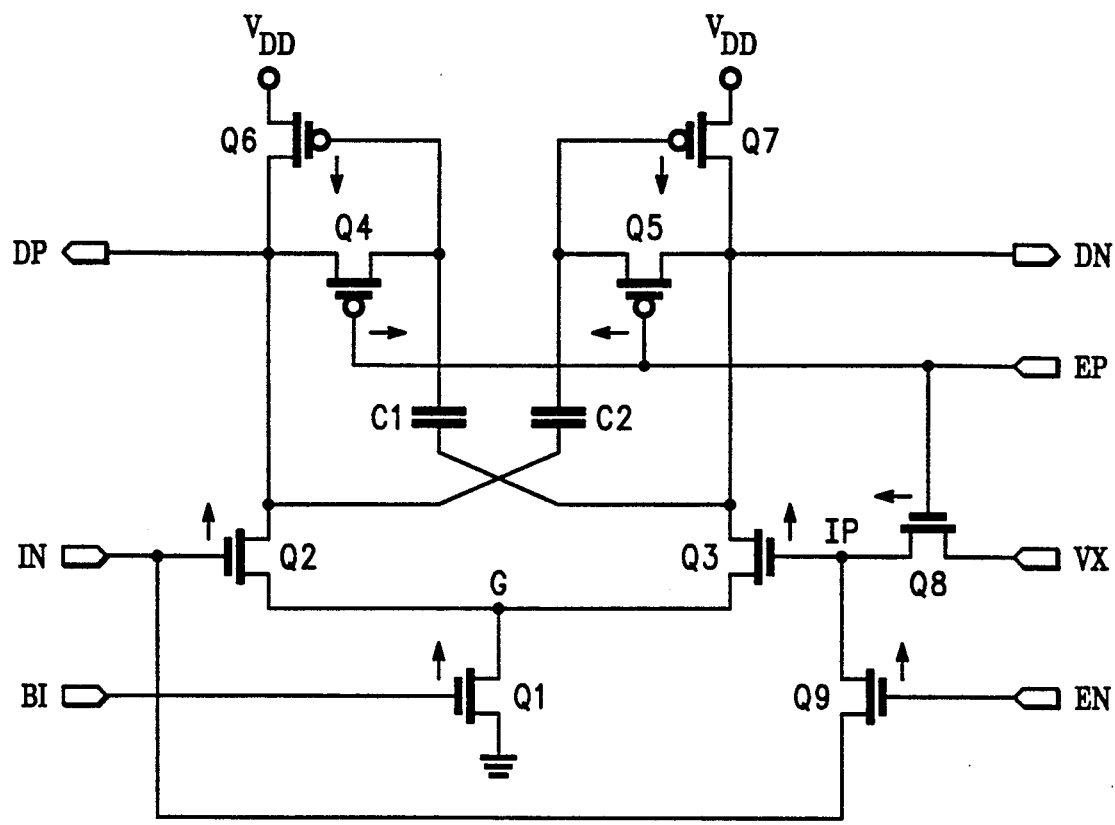
FIG. 1 is a circuit diagram of one embodiment of the present invention.

The offset cancel latching comparator according to the present invention will now be described in detail with reference to a preferred embodiment thereof, which is illustrated in FIG. 1. As shown in a circuit diagram in FIG. 1, this preferred embodiment of the latching comparator includes a first pair of n-channel field effect transistor Q2 and Q3. A reference input terminal or an inverting input terminal IN is connected to the gate of transistor Q2, and an inverting input voltage is supplied from terminal IN to transistor Q2. A non-inverting input terminal VX is connected to the gate of transistor Q3 through an n-channel field effect transistor Q8 and an inverting input node IP, and a non-inverting voltage is supplied from terminal VX to transistor Q3. Transistor Q8 is controlled by a clock input at a terminal EP. Thus, differential input voltages are fed to the latching comparator.

For the purpose of offset sampling, inverting input terminal IN is further coupled to the gate of transistor Q3 via an n-channel field effect transistor Q9, which is controlled by another clock input at a terminal EN. When a high level signal is given to terminal EN, transistor Q9 turns on and the voltage at node IP becomes the same as the inverting input voltage at terminal IN to enable the offset sampling. On the contrary, when a low level signal is given to terminal EN and a high level signal is given to terminal EP, transistor Q9 turns off and transistor Q8 turns on to enter into the comparison period.

The sources of transistors Q2 and Q3 both are connected to the drain of an n-channel field effect transistor Q1, which functions as a constant current source under the control of a bias voltage at terminal B1. A non-inverting output terminal DP and an inverting output terminal DN are connected to the drains of transistors Q2 and Q3 respectively.

The latching comparator also comprises a second pair of p-channel field effect transistors Q6 and Q7. The sources of transistors Q6 and Q7 both are connected to a voltage supply VDD. The drain of transistor Q6 is connected to the drain of transistor Q2, and the drain of transistor Q7 is connected to the drain of transistor Q3. The gate of transistor Q6 is connected to the drain of transistor Q2 via a p-channel field effect transistor Q4, and connected to the drain of transistor Q3 via a capacitor C1. The gate of transistor Q7 is connected to the drain of transistor Q3 via a p-channel field effect transistor Q5, and connected to the drain of transistor Q2 via a capacitor C2. Transistors Q4 and Q5 are controlled by the clock input at terminal EP.

Figure 3E:
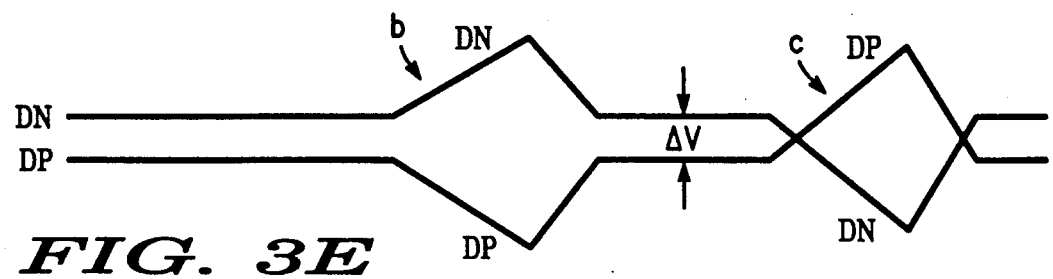

In operation, during the offset sampling period where terminal EP is low and terminal EN is high (shown at "a" in FIG. 3A), terminals IN and IP are at the same voltage level making the input voltage difference zero. The outputs of DP and DN are not connected to each other. Terminals DP and DN are shorted to one side of each of capacitors C1 and C2 through transistors Q4 and Q5, respectively. Therefore, both outputs are clamped at certain voltages which are determined depending on the drain currents of transistors Q2, Q3 and p-channel load transistors Q6, Q7. If it is assumed that there is no offset voltage in the circuit, then the voltages at terminals DP and DN become equal to each other. And two capacitors C1 and C2 are not charged. However, the actual comparator necessarily has mismatching in the circuit, and the voltages at terminals DP and DN become different. This output voltage difference, delta V, is stored in the capacitors C1 and C2 (FIG. 3E). For example, if there is an offset tendency that DN becomes higher than DP at zero differential input, the Q3 side of capacitor C1 stores a positive charge.

During a comparison period (shown at "b" in FIG. 3A), transistors Q4, Q5 and Q9 is turned off and transistor Q8 is turned on, and the inverting input voltage at IN and the non-inverting input voltage at IP are supplied to transistors Q2 and Q3 respectively for comparing. At the beginning point in the comparison period, the output voltage difference (delta V) generated during the offset sampling period remains in the circuit. At the next instant, the voltages at terminals DN and DP start to change, because the drain currents through transistors Q2 and Q3 begin to differ from each other due to the input voltage difference between IN and IP (VX). P-channel transistors Q6 and Q7 have higher gain after clamping transistors Q4 and Q5 are turned off. The drain current difference between load transistors Q6 and Q7 causes the voltage difference at the gates thereof via capacitors C1 and C2. This positive feedback loop amplifies the output voltage difference similar to the prior comparator. The comparator according to the present invention has a feature that the output voltages at DN and DP always move from the offset state in the proper direction during the comparison period.

More specific operation will be described. At the beginning point in the comparison period, the output voltage difference (delta V) remains in the circuit as mentioned above. When a low level is given at IP and a high level is given at IN (shown at "b" in FIG. 3E), n-channel transistor Q3 moves toward non conduction and its resistance increases, leading to the drain current reduction, which raises the voltage at DN that was slightly high originally. This rise of the voltage at DN pushes up the gate voltage of transistor Q6 through charging of capacitor C1. Therefore, transistor Q6 conducts less, its drain current decreases and its resistance increases to further reduce the voltage at DP that was originally low. This reduction of the voltage at DP pulls down the gate voltage of transistor Q7 through charging of capacitor C2. As a result, transistor Q7 conducts more, its drain current increases, and the voltage at DN further increases. This operating positive feedback loop finally provides the proper output of the latching comparator.

Contrary to the above, when a high level is given at IP and a low level is given at IN (shown at "c" in FIG. 3E), n-channel transistor Q3 conducts more and its resistance decreases, leading to increasing of the drain current which is partially supplied from pre-charged capacitor C1. This lowers the voltage at DN that was slightly high originally. This reduction of the voltage at DN pulls down the gate voltage of transistor Q6 through discharging and sequential reverse charging of capacitor C1. Therefore, transistor Q6 conducts more, its drain current increases and its resistance decreases to slightly raise the voltage at DP that was originally low. This rise of the voltage at DP pushes up the gate voltage of transistor Q7 through discharging and sequential reverse charging of capacitor C2. Then, transistor Q7 conducts less, its drain current decreases, and the voltage at DN further decreases. This further decrease of the voltage at DN further pulls down the gate voltage of transistor Q6 through reverse charging of capacitor C1. This operating positive feedback loop finally overcomes the offset tendency and provides the proper output of the latching comparator.

The offset cancel latching comparator according to the present invention can easily cancel the offset voltage and provide the correct comparison outputs without increasing die cost, by storing offset information in two capacitors during the offset sampling period.

While the present invention has been shown and described with reference to a particular embodiment thereof, various modifications and changes thereto will be apparent to those skilled in the art and are within the spirit and scope of the present invention.

I claim:

1. An offset cancel latching comparator, comprising:
   first and second input terminals;
   first and second output terminals;
   current source means having an output for providing a current of predetermined magnitude;
   first and second transistors forming a differential pair and each having first and second electrodes and a control electrode, said control electrodes of said first and second transistors being coupled to said first and second input terminals respectively, said first electrodes of said first and second transistors being coupled together to said output of said current source means, said second electrode of said second transistor being coupled to said first output terminal, said second electrode of said first transistor being coupled to said second output terminal;
   third and fourth transistors each having first and second electrodes and a control electrode, said first electrodes of said third and fourth transistors being coupled together to a voltage supply, said second electrode of said third transistor being coupled to the second electrode of said first transistor, said second electrode of said fourth transistor being coupled to the second electrode of said second transistor;
   a first capacitor having a first terminal coupled to said control electrode of said third transistor and a second terminal coupled to said second electrode of said second transistor;
   first switch means coupled between said first terminal of said first capacitor and said second electrode of said third transistor for transferring a charge developed at said second electrode of said third transistor to said first capacitor;
   a second capacitor having a first terminal coupled to said control electrode of said fourth transistor and a second terminal coupled to said second electrode of said first transistor; and
   second switch means coupled between said first terminal of said second capacitor and said second electrode of said fourth transistor for transferring a charge developed at said second electrode of said fourth transistor to said second capacitor.

2. The offset cancel latching comparator in accordance with claim 1 further including third switch means coupled between said first input terminal and said control electrode of said second transistor for enabling conduction therebetween.

3. The offset cancel latching comparator in accordance with claim 2 further comprising fourth switch means inserted between said second input terminal and the control electrode of said second transistor.

4. The offset cancel latching comparator in accordance with claim 3 wherein all the transistors are field effect transistors.

5. The offset cancel latching comparator in accordance with claim 4 wherein said third and fourth transistor are p-channel field effect transistors and other said transistors are n-channel field effect transistors.

6. The offset cancel latching comparator in accordance with claim 5 wherein said control electrodes of all said transistors are gate electrodes.

7. The offset cancel latching comparator in accordance with claim 6 wherein said first electrodes of all said transistors are source electrodes.

8. The offset cancel latching comparator in accordance with claim 7 wherein said second electrodes of all said transistors are drain electrodes.

9. The offset cancel latching comparator in accordance with claim 8 wherein all said switches are externally synchronously controlled.

10. An offset cancel latching comparator, comprising:

current source means having an output for providing a current of predetermined magnitude;

first and second field effect transistors forming a differential pair and each having a gate, a drain and a source electrode, said source electrodes of said first and second transistors being coupled together to said output of said current source means;

a first input terminal coupled to said gate electrode of said first transistor;

a second input terminal coupled to said gate electrode of said second transistor;

a first output terminal coupled to said drain electrode of said second transistor;

a second output terminal coupled to said drain electrode of said first transistor;

third and fourth transistors each having a gate, a drain and a source electrode, said source electrodes of said third and fourth transistors being coupled together to a voltage supply, said drain electrode of said third transistor being coupled to said drain electrode of said first transistor, said drain electrode of said fourth transistor being coupled to said drain electrode of said second transistor;

a first capacitor having a first terminal coupled to said gate electrode of said third transistor and a second terminal coupled to said drain electrode of said second transistor;

first switch means coupled between said first terminal of said first capacitor and said drain electrode of said third transistor for transferring a charge developed at said second output terminal to said first capacitor;

a second capacitor having a first terminal coupled to said gate electrode of said fourth transistor and a second terminal coupled to said drain electrode of said first transistor; and second switch means coupled between said first terminal of said second capacitor and said drain electrode of said fourth transistor for transferring a charge developed at said first output terminal to said second capacitor.

11. The offset cancel latching comparator in accordance with claim 10 further including:

third switch means coupled between said first input terminal and said gate electrode of said second transistor for enabling conduction therebetween; and fourth switch means coupled between said second input terminal and said gate electrode of said second transistor for enabling conduction therebetween.

12. The offset cancel latching comparator in accordance with claim 11 wherein said third and fourth transistor are p-channel field effect transistors and other said transistors are n-channel field effect transistors.

13. The offset cancel latching comparator in accordance with claim 12 wherein all said switches are field effect transistors externally controlled synchronously.

* * * * *